United States Patent [19]

Luo

[11] 4,040,073
[45] Aug. 2, 1977

[54] THIN FILM TRANSISTOR AND DISPLAY PANEL USING THE TRANSISTOR

[75] Inventor: Fang-Chen Luo, Turtle Creek, Pa.

[73] Assignee: Westinghouse Electric Corporation, Pittsburgh, Pa.

[21] Appl. No.: 716,046

[22] Filed: Aug. 20, 1976

Related U.S. Application Data

[63] Continuation-in-part of Ser. No. 609,139, Aug. 29, 1975, abandoned.

[51] Int. Cl.² .......................................... H01L 27/12
[52] U.S. Cl. ....................................... 357/4; 357/23; 357/61; 357/63; 148/186
[58] Field of Search .................. 357/61, 63, 23, 4, 41; 148/186, 188

[56] References Cited

U.S. PATENT DOCUMENTS

| | | | |
|---|---|---|---|
| 3,289,053 | 11/1966 | Haering | 317/235 |
| 3,289,054 | 11/1966 | Haering | 317/235 |
| 3,304,469 | 2/1967 | Weimer | 317/234 |
| 3,512,041 | 5/1970 | Dalmarso | 315/169 |
| 3,598,760 | 8/1971 | Nakamura | 252/501 |
| 3,735,212 | 5/1973 | Kun | 317/234 R |

*Primary Examiner*—Martin H. Edlow
*Attorney, Agent, or Firm*—W. G. Sutcliff

[57] ABSTRACT

A double gated thin film field effect transistor in which cadmium selenide is the semiconductor material. A thin layer of indium is provided on either side of the cadmium selenide conducting channel and after annealing enhances the transconductance of the device and reduces trapping of charge in the semiconductor. The source and drain contacts of the device are a combination of an indium layer and a copper layer which improve the performance of the device.

13 Claims, 10 Drawing Figures

THIN FILM TRANSISTOR AND DISPLAY PANEL USING THE TRANSISTOR

This application is a continuation-in-part of application Ser. No. 609,139 filed Aug. 29, 1975, now abandoned and assigned to the same assignee as this application.

BACKGROUND OF THE INVENTION

The present invention relates to a thin film field effect transistor device and to a display panel made using such devices. Thin film field effect transistors are now well known in the art, and typically use cadmium sulfide or cadmium selenide as the semiconducting material. It has been the practice to utilize gold, aluminum and indium-gold as the source and drain contacts of such devices. Double gated field effect transistors are also known in the art both for silicon devices and for thin film transistors. A double gated thin film transistor is shown in U.S. Pat. No. 3,500,142.

One of the prime areas for use of thin film transistors of the present invention are in large area flat panel display devices. In such devices an array of thin film transistors is disposed upon a substrate and used to control and drive an individual display medium associated with a specific unit display cell which is repeated across the entire area of the display panel. Such a device is seen in U.S. Pat. No. 3,840,695 in which a thin film transistor array is integrated with a liquid crystal display panel. In such thin film transistor control and drive flat panel displays, the array of display elements is interwoven together through thin film transistors via horizontal and vertical bus bars. The gates of one row of thin film transistors are connected to one horizontal bus bar and are electrically insulated from vertical source bus bars. Individual display elements can be addressed through the source bus bar only when a positive bias is applied to the gate of its corresponding thin film transistor and turns the transistor device on. In order to display information on the panel, electrical signals applied to both the gate and source bus bars must be free of distortion. If there are electrical shorts between the gates and sources, severe cross-talking between different display elements will occur and will result in smeared pictures. Other display mediums besides liquid crystals are suggested for use in such display panels, including electroluminescent phosphor display medium. The electroluminescent medium presents a more complex problem than the liquid crystal display medium because it requires a much higher operational voltage to produce light output. A significant problem with prior art thin film transistor devices has been that with the heretofore utilized source and drain contact materials the devices have been unable to withstand large voltages across the source and drain. Such prior art devices could thus not be used to effectively drive an electroluminescent display panel.

An important transistor operational parameter for transistor control flat panel display devices is that the devices have a high transconductance. A high transconductance means that the device has a high on-off ratio which is required because of the addressing schemes in which display information must be stored on a line of display elements and held at a fairly constant level until their refresh frame occurs. In the preferred unit cell control circuit for a flat panel display device a logic or switching transistor has its gate connected to a synchronizing signal bus bar which turns on the logic or switching transistor and permits display information to be addressed through the transistor to a storage capacitor. The logic or switching transistor is thereafter turned off and remains in an off state with the voltage on the capacitor being applied to the gate of a control transistor which actually controls power to the electro luminescent display medium. It is very important that the voltage on the storage capacitor remain relatively constant until the refresh frame. A further problem with prior art thin film transistors is the trapping of charges which can result in drift in the operational characteristic of the device. This is a particular problem at high switching rates such as at video switching rates for which the display panel is desirable.

SUMMARY OF THE INVENTION

A gated, thin film, field effect transistor device in which cadmium selenide is utilized as the semiconductive conducting channel with indium incorporated into the cadmium selenide to improve the device stability and transconductance. The source and drain contacts of the device comprise a thin layer of indium covered with a relatively thicker layer of copper. The device exhibits significantly improved transconductance and reduced charge trapping, as well as significantly improved high voltage performance.

DESCRIPTION OF THE PREFERRED EMOBODIMENT

Figure 1:
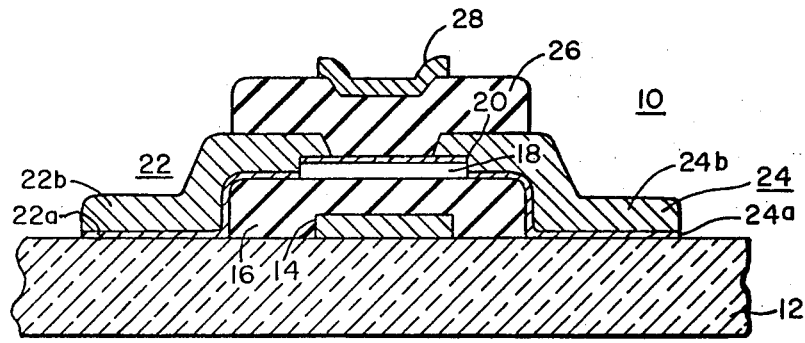
FIG. 1 is an enlarged cross-sectional view of the thin film transistor structure of the present invention prior to annealing.
Figure 7:
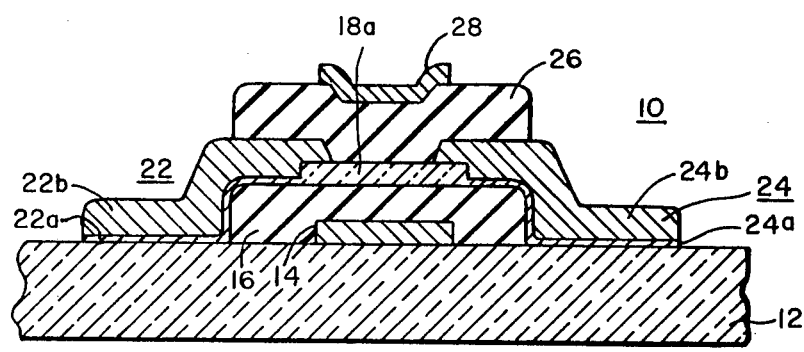
FIG. 7 is an enlarged cross-sectional view of the thin film transistor device of FIG. 1 after annealing.

The thin film transistor device 10 is seen in FIGS. 1 and 7 disposed upon a thin glass substrate 12. The thin film transistor device 10 is vapor deposited onto the glass substrate in successive steps. A first gate electrode 14 is disposed directly upon the glass substrate and is typically a layer of about 600 Angstroms thickness of aluminum. A first insulating layer 16 is disposed over the first gate electrode 14 and typically comprises an aluminum oxide layer which is about 5,000 Angstroms thick. The first gate electrode 14 extends beyond the insulating layer at least on one side to permit connection. A pad of cadmium selenide semiconductive material 18 is thereafter deposited on the first insulating layer, generally overlaying the first gate electrode. The cadmium selenide is preferably deposited in a thickness of from 100 to 200 Angstroms. In the preannealed structure seen in FIG. 1, a thin layer of indium 20 is thereafter deposited atop the cadmium selenide and is coextensive with the cadmium selenide pad. The indium is deposited in a very thin layer, typically about 5 Angstroms thick. The indium may be deposited on either the lower or upper surface of the cadmium selenide so that the indium may be directly deposited onto the first insulating layer and covered with the cadmium selenide or it may be deposited on both sides of the cadmium selenide. A conductive source contact 22 and drain contact 24 are disposed overlapping opposed sides of the cadmium selenide semiconductive channel. The source and drain contacts extend from the glass substrate up over the first insulating layer and overlap a portion of the cadmium selenide. The source 22 and drain 24 contacts are a combination of a first thin indium layer 22a, 24a which are from several Angstroms to about 500 Angstroms in thickness and a preferred thickness of 100 Angstroms. The indium layer is covered with a layer of copper 22b, 24b which is from about 600 to 2,000 Angstroms thick, and typically is about 1,000 Angstroms thick. When the indium layer exceeds about 500 Angstroms as the intial contact layer, the indium from this thick contact layer will diffuse into the cadmium selenide channel during annealing and adversely affect the functionality of the channel. The copper layer thickness is largely determined by the current requirement for the device. A minimum copper layer thickness is required to protect the indium preventing oxidation and diffusion. The spacing between the source and the drain contacts across the cadmium selenide is maintained at about 1 to 3 mils. A second insulating layer 26 is then disposed over the source and drain contacts and indium covered cadmium selenide layer. The second insulating layer 26 is also preferably aluminum oxide in a thickness of about 5,000 Angstroms. A second gate electrode 28 is disposed atop the second insulating layer and is disposed over the cadmium selenide semiconductive channel, which second gate is typically a layer of aluminum which is about 600 Angstroms thick. The first and second gate electrodes are electrically connected beyond the extent of the first and second insulating pads or layers. The dimensions of the cadmium selenide semiconductive channel between the source and drain contacts may be varied in accordance with the function of the device. A shorter channel length, of about 1 mil produces a higher on-off ratio because of the lower device capacitance. The channel length must sustain the operational voltage and a channel length of about 2-2.5 mil has been found useful for flat panel electro-luminescent display use. The evaporation mask used in fabrication also limits the channel length. The channel width can be just about unlimited. For the logic or switching transistor $T_1$ a width of 2 mils is convenient, and 5 mils for the control or power transistor $T_2$.

The transistor device is annealed in a non-oxidizing atmosphere such as nitrogen for about 10 hours at about 300° C. The annealing at this temperature effectively causes the indium of layer 20 to diffuse into the cadmium selenide layer 18, and to be uniformly distributed through the now doped layer 18a as a dopant per the after annealing structure seen in FIGS. 7 and 8. The majority charge carriers in cadmium selenide are electrons, and the indium serves as an electron donor. These indium electrons will tend to fill the charge traps which are present in the semiconductor producing greatly improved stability for the resultant transistor. The charge induced in the semiconductor by the gate potential is thus effective to enhance the current carrying capability of the device and permit accurate modulation.

The indium content can be varied to produce the desired level of stability, i.e. uniformity of current conduction for given applied potential with time. The indium layer 18 is taught as being about 5 Angstroms. An indium layer of 10 Angstroms was found to be effective in producing stable devices, but at greater indium levels the amount of charge carrier present in the semiconductor can be too high resulting in an undesirable current level at zero bias on the gate. Additional indium will eventually result in the semiconductor becoming a conductive channel incapable of transistor operation. In like manner, in the embodiment of FIGS 6 and 8, the indium after annealing is present in the doped cadmium selenide layer 42a.

The stability of a prior art cadmium selenide channel thin film transistor was so poor that its use in a display device was not practical. By way of example, such a device exhibited about a 50% change in the on impedance of the transistor device in a time period of about 10 minutes. The incorporation of indium into the cadmium selenide provides a device wherein the on impedance change during the same time period is less than about 1%. The data presented in FIG. 4, also shows the stability of the indium doped device of the present invention in the time scale of 60 cycle operation versus pulse operation, with the 60 cycle operation being comparable to the frame refresh rate for most display applications.

The indium and copper layers which comprise the drain and source contacts form somewhat of an intermetallic mixture at the layer interface when the device is annealed. The use of the indium layer with the copper has been found to greatly improve the ability of the device to withstand voltages across the device without breaking down.

Figure 2:
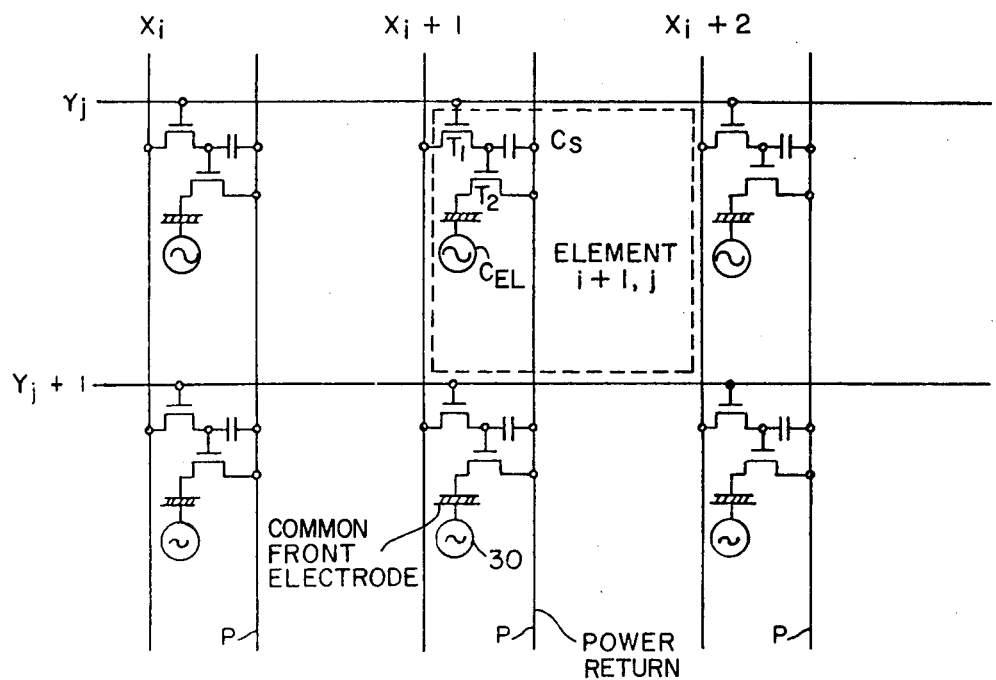
FIG. 2 is a schematic representation of a thin film display panel in which transistor devices of FIG. 1 are incorporated.
Figure 3A:
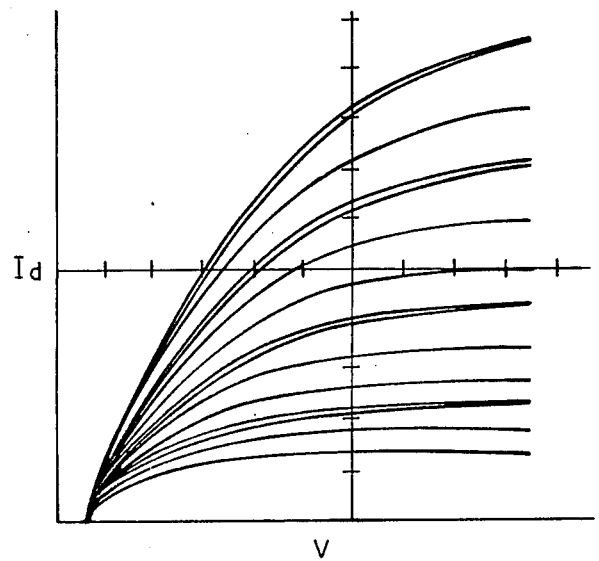
FIGS. 3A and 3B are graphs illustrating the operational characteristics of the transistor devices of the present invention before and after annealing.
Figure 3B:
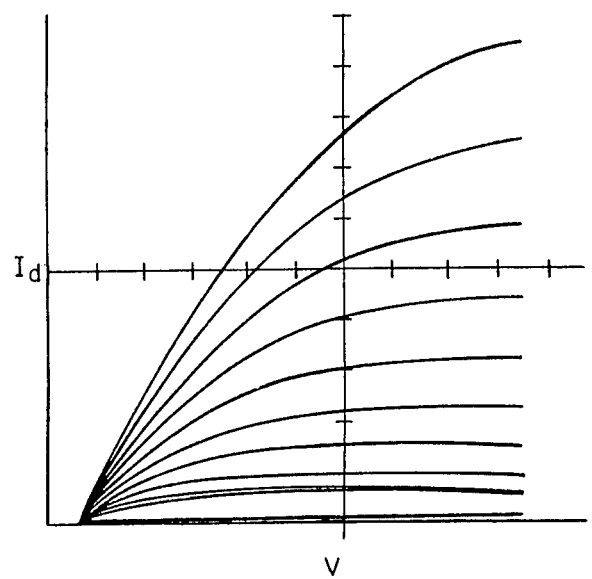
Figure 4:
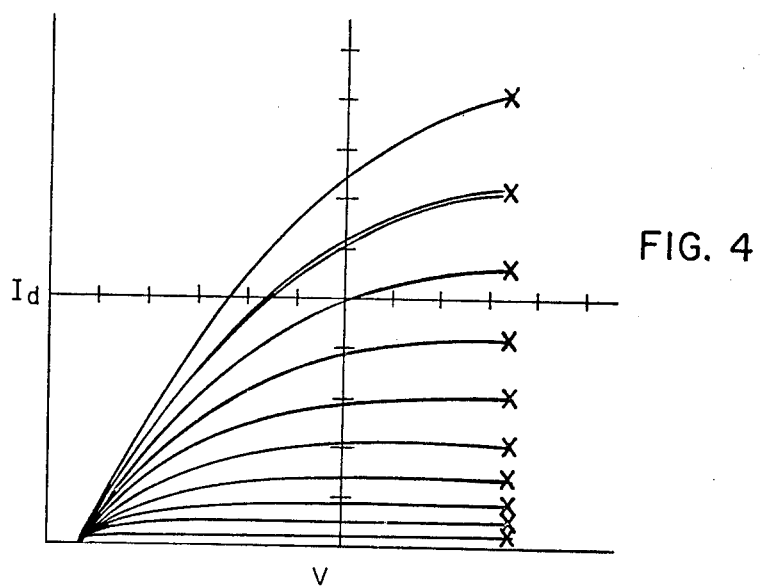
FIG. 4 is a graph of the operational characteristics of the device illustrating the high frequency stability of the device.
Figure 5A:
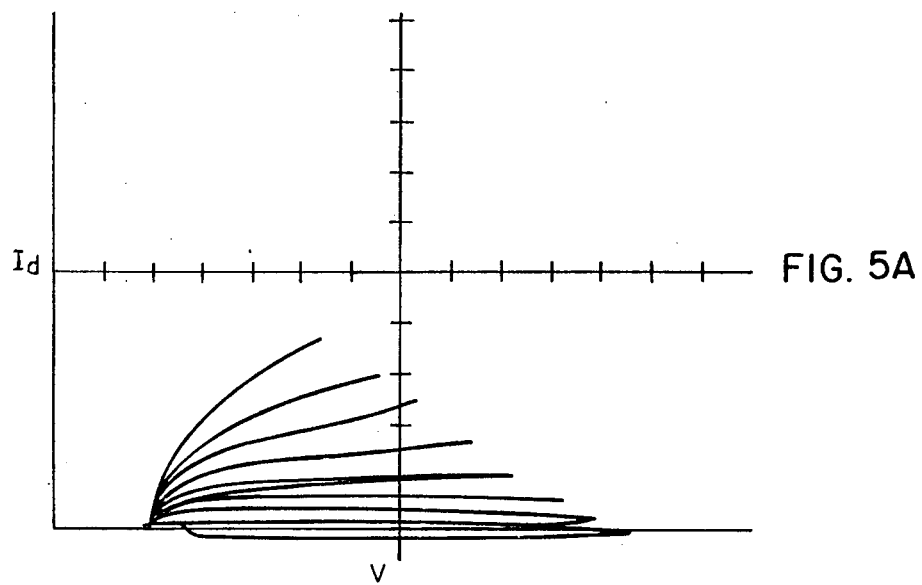
FIGS. 5A and 5B illustrate the comparison between a high voltage performance characteristic of a thin film transistor using aluminum source and drain contacts using FIG. 5A in the device of the present invention and FIG. 5B.
Figure 5B:
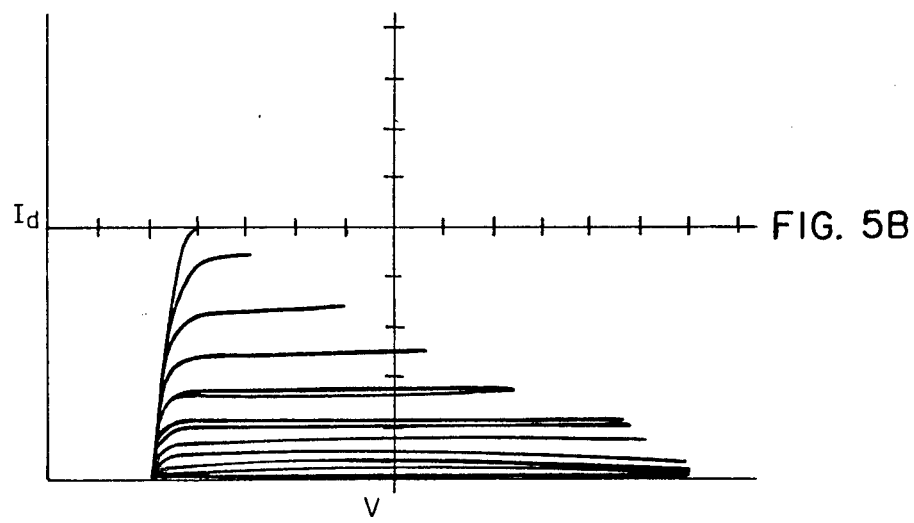

FIG. 2 shows a schematic illustration of the flat panel display device which utilizes the transistors of the present invention. A single unit display cell is outlined by the dotted lines, and is defined between horizontal switching signal bus bars $Y_j$, $Y_{j+1}$, and vertically disposed information signal bus bars $X_i$, $X_{i+1}$, $X_{i+2}$. An additional parallel vertical bus bar P is provided which provides a common electrode for connection to the power supply for operation of the device. A logic or switching transistor $T_1$ has its gate connected to the switching signal bus bar $Y_j$ with its source connected to the vertical information signal bus bar $X_{i+1}$. The drain of the logic or switching transistor $T_1$ is connected to one side of a thin film storage capacitor $C_s$ and also to the gate of control or power transistor $T_2$. One of the contacts of transistor $T_2$ is connected to one electrode side of the electro luminescent display element which may cover a portion of or the entire unit cell area. The other contact of transistor $T_2$ is connected to the reference or ground bus. The other electrode of the electroluminescent cell is connected to a high frequency drive potential source. The other side of the storage capacitor $C_2$ is also connected to the reference potential bus. The individual transistor device of the present invention or more typically an array of such devices incorporated in a display matrix such as shown in FIG. 2 is fabricated and then annealed in a non-oxidizing atmosphere such as a nitrogen atmosphere for about 10 hours at about 300° C. The annealing process improves the electrical properties of the device. In FIG. 3A, the electrical properties of the device prior to annealing are illustrated, and FIG. 3B illustrates the electrical operation of the device after the annealing process and illustrates the higher transconductance values, that is the higher on/off resistance ratio of the device following annealing. In FIGS. 3A and 3B a family of curves is shown generated at 60 cycle operation. The vertical plot is of drain current with each vertical division being 10 microamps in FIG. 3A, and 20 microamps in FIG. 3B. The horizontal plot is the source to drain voltage with each division being 2V. The gate bias is stepped in 2V increments to generate the family of curves. The transconductance is defined as the ratio of drain current to gate bias, and it can be readily seen that the tranconductance of the device after annealing is about doubled. FIG. 4 illustrates operation of the device, and illustrates the improved stability of the device and greatly reduces fast trapping of charge for such devices. In FIG. 4, a family of V-I curves is again illustrated for the device of the present invention, generated at 60 cycles. The vertical plot is drain current at 20 microamps per division, and the horizontal plot is source to drain voltage at 2 volts per division. The gate bias is stepped in 2 volt increments to generate the family of curves. Superimposed on the family of curves, and at the end of each marked by the x is the output which is generated by applying an 80 microsecond gate bias pulse applied at the time of maximum source to drain voltage. The correspondence of the dots on the family of curves shows the lack of charge trapping. FIGS. 5A and 5B illustrate one of the major advantages of the device of the present invention. FIG. 5A illustrates the prior art double gated thin film transistor device in which aluminum source and drain contacts were utilized. FIG. 5A illustrates the high voltage collapse of the device at typically about 100 volts. FIG. 5B illustrates the high voltage capability of the device of the present invention with indium-copper source-drain contacts, and illustrates that the device can stand greater than 350 volts without breakdown or collapse. FIGS. 5A and 5B show drain current on the vertical plot at 20 microamps per division in FIG. 5A, and 50 microamps per division in FIG. 5B. The horizontal plots are source to drain voltage at 10V per division in FIG. 5A, and 20V per division in FIG. 5B. The gate bias is stepped at 2V increments in each case.

Figure 6:
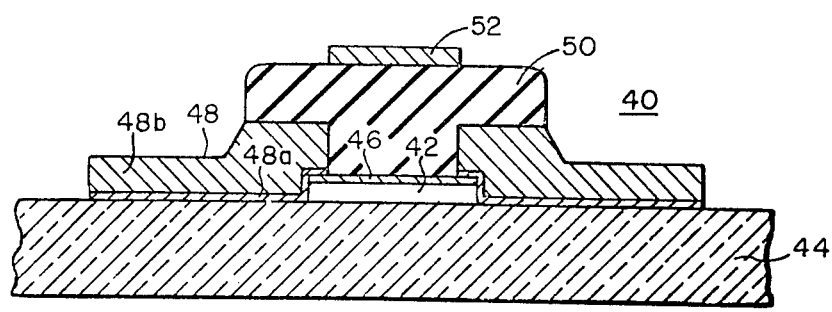
FIG. 6 is an enlarged cross-sectional view of an alternate embodiment thin film transistor structure prior to annealing.
Figure 8:
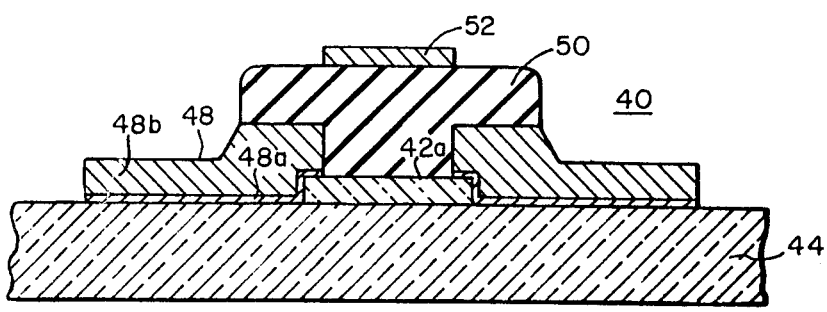
FIG. 8 is an enlarged cross-sectional view of the thin film transistor device of FIG. 6 after annealing.

An alternate embodiment thin film transistor device is seen in FIG. 6 before annealing and in FIG. 8 after annealing. The transistor 40 differs from the other embodiment only in that this device is a single gate device. The cadmium selenide layer 42 is disposed directly on the insulating substrate 44. A thin indium layer 46 is disposed atop the cadmium selenide layer 42. The plural layer source and drain contacts 48 overlap opposed ends of the cadmium selenide. The contacts 48 comprise an initial indium layer 48a and a copper layer 48b disposed thereon as already described with respect to the embodiment of FIGS. 1 and 7. An insulating layer 50 covers the semiconductive channel and a portion of the contacts. Gate 52 is disposed on the insulator 50 over the semiconductive channel.

The double gated device of FIG. 7 enhances the inducing of charge in the semiconductive cadmium selenide channel, and the single gate device of FIG. 8 is an alternate design.

I claim:

1. A thin film transistor disposed upon an insulating substrating comprising.
   a. a first conductive gate disposed on the substrate;
   b. a first insulating layer atop the first conductive gate, which the first conductive gate extends beyond the first insulating layer;
   c. a semiconductive layer disposed on the first insulating layer overlaying at least a portion of the first conductive gate with sufficient indium incorporated in the semiconductive layer to stabilize the device;
   d. source and drain conductive contacts overlapping opposed sides of the semiconductive layer, which source and drain conductive contacts comprise a layer of indium with a layer of copper thereon;
   e. a second insulating layer disposed on the semiconductive layer and on a portion of the source and drain contacts; and
   f. a second conductive gate disposed atop the second insulating layer above the semiconductive layer, the second conductive gate being electrically connectable to the first gate.

2. The thin film transistor specified in claim 1, wherein the semiconductive material is cadmium selenide.

3. The thin film transistor specified in claim 1, wherein an indium layer is disposed on at least one side of the semiconductive layer to a thickness of about 5 Angstroms and the indium is incorporated into the semiconductive layer by annealing.

4. The thin film transistor specified in claim 1, wherein the source and drain conductive contacts comprise an indium layer which is up to about 500 Angstroms thick, and a copper layer atop the indium which copper layer is from 600 to 2,000 Angstroms thick.

5. The thin film transistor specified in claim 1, wherein the source and drain indium layer is preferably about 100 Angstroms thick, and the copper layer is preferably about 1,000 Angstroms thick.

6. A thin film transistor device disposed upon a high temperature resistant glass substrate comprising:
   a. a first aluminum gate layer disposed on the glass substrate;
   b. a first insulating layer of aluminum oxide disposed atop the first aluminum conductive gate, which first aluminum gate extending beyond the first insulating layer;
   c. a semiconductive layer of cadmium selenide disposed on the first insulating layer overlaying at least a portion of the first aluminum gate with sufficient indium incorporated in the semiconductive layer to stabilize the device;
   d. source and drain conductive contacts overlapping and contacting opposed sides of the semiconductive layer, which source and drain conductive contacts comprise an indium layer which is up to about 500 Angstroms thick, and a copper layer atop the indium layer of from 600 to 2,000 Angstroms thick;
   e. a second insulating layer of aluminum oxide disposed on the indium layer atop the semiconductive layer, and on at least a portion of the source and drain contacts which overlap the semiconductive layer; and
   f. a second aluminum gate disposed atop the second insulating layer above the semiconductive layer.

7. A thin film transistor device in which a thin channel of cadmium selenide is the semiconductive current carrying channel, and wherein a thin layer of indium is disposed on at least one side of the thin cadmium selenide channel, which indium is incorporated into the cadmium selenide by annealing the device in a non-oxidizing atmosphere, and the source and drain contacts at opposed ends of the cadmium selenide channel comprise a thin indium layer and a layer of copper disposed atop the indium.

8. The thin film transistor device specified in claim 7, wherein a thin indium layer of about 5 Angstroms thickness is disposed atop the cadmium selenide channel and thereafter incorporated into the cadmium selenide by annealing, and the source and drain comprises an indium layer which is up to about 500 Angstroms thick and a copper layer thereon of from about 600 to 2,000 Angstroms thick.

9. The thin film transistor device specified in claim 7, wherein the device is annealed in a non-oxidizing atmosphere at about 300° C for about 10 hours.

10. A thin film transistor disposed upon an insulating substrate comprising:
 a. a semiconductive layer of cadmium selenide disposed upon the insulating substrate with sufficient indium incorporated in the cadmium selenide layer to stabilize the device;
 b. source and drain conductive contacts overlapping and contacting opposed sides of the cadmium selenide, which source and drain contacts comprise a layer of indium with a layer of copper disposed thereon;
 c. an insulating layer disposed over the indium layer atop the cadmium selenide and overlapping a portion of the source and drain contacts; and
 d. a conductive gate disposed atop the insulating layer above the semiconductive layer.

11. The thin film transistor device specified in claim 10, wherein the indium layer of the source and drain conductive contacts is up to about 500 Angstroms thick, and the copper layer disposed atop this indium layer is from about 600 to 2,000 Angstroms thick.

12. The method of producing a stabilized thin film field effect transistor in which cadmium selenide is the semiconductive material, which transistor exhibits a high withstand voltage across the device, which method comprises:
 a. depositing plural layer source and drain contacts upon opposed ends of the cadmium selenide layer, with a first layer being indium and a second layer atop the indium of copper;
 b. depositing indium in contact with cadmium selenide in the area between the source and drain contacts; and
 c. annealing the device by heating in a nonoxidizing atmosphere at a temperature sufficient to incorporate the deposited indium in the area between the source and drain contacts throughout the cadmium selenide.

13. The method set forth in claim 12, wherein the indium deposited in step (b), is deposited to a thickness of about 5 Angstroms.

* * * * *